(12) United States Patent
Pfeiffer

(10) Patent No.: US 9,954,342 B2
(45) Date of Patent: Apr. 24, 2018

(54) SELF-HEATING MITIGATION IN AN ACOUSTICALLY TUNABLE DISTRIBUTED FEEDBACK LASER

(71) Applicant: Alcatel Lucent, Boulogne-Billancourt (FR)

(72) Inventor: Thomas Pfeiffer, Stuttgart (DE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/539,327

(22) PCT Filed: Dec. 14, 2015

(86) PCT No.: PCT/EP2015/079522
§ 371 (c)(1),
(2) Date: Jun. 23, 2017

(87) PCT Pub. No.: WO2016/116224
PCT Pub. Date: Jul. 28, 2016

(65) Prior Publication Data
US 2017/0365980 A1    Dec. 21, 2017

(30) Foreign Application Priority Data

Jan. 23, 2015  (EP) .................................... 15290046

(51) Int. Cl.
*H01S 3/10* (2006.01)
*H01S 5/12* (2006.01)
(Continued)

(52) U.S. Cl.
CPC ............ *H01S 5/1234* (2013.01); *H01S 5/068* (2013.01); *H01S 5/0617* (2013.01)

(58) Field of Classification Search
CPC ................................ H01S 5/0617; H01S 5/068
(Continued)

(56) References Cited

U.S. PATENT DOCUMENTS 4,217,036 A * 8/1980 Chang ..................... G02F 1/116
359/286
4,297,704 A * 10/1981 Marom .................... G01S 3/14
324/76.36
(Continued)

OTHER PUBLICATIONS

Van Veen Doutje et al: "Measurement and mitigation of wavelength drift due to self-heating of tunable burst-mode DML for TWDM-PON", OFC 2014, OSA, Mar. 9, 2014 (Mar. 9, 2014), pp. 1-3.*
(Continued)

*Primary Examiner* — Tuan Nguyen
(74) *Attorney, Agent, or Firm* — Harness, Dickey & Pierce, P.L.C.

(57) ABSTRACT

The laser assembly includes a semiconductor with an active semiconductor region, a controllable oscillator for generating a periodic electric signal that is applied to the semiconductor laser to generate a surface acoustic wave in or near the active semiconductor region such that a diffraction grating structure is created in or near the active semiconductor region by the surface acoustic wave, an emission wavelength of the active semiconductor region being determined by a periodicity of the diffraction grating structure, wherein the controllable oscillator is configured to set a frequency of the periodic electric signal in accordance with a control signal, and a control circuit for generating the control signal for the controllable oscillator in such a manner that a shift of the emission wavelength from heating of the active semiconductor region during emission of the optical signal is at least partially compensated by an opposite shift of the emission wavelength from a change of the periodicity of the diffraction grating structure in or near the active semiconductor region.

15 Claims, 4 Drawing Sheets

(51) Int. Cl.
*H01S 5/06* (2006.01)
*H01S 5/068* (2006.01)
(58) Field of Classification Search
USPC .................................................... 372/20, 36
See application file for complete search history.

(56) References Cited

U.S. PATENT DOCUMENTS

2003/0174950 A1* 9/2003 Akiyama ................ G02F 1/125
   385/37
2004/0125829 A1* 7/2004 Williams .............. H01S 5/0607
   372/20

OTHER PUBLICATIONS

Doutje van Veen. Measurement and Mitigation of Wavelength Drift due to Self-Heating of Tunable Burst Mode DML for TWDM-PON. OFC 2014, OSA, Mar. 9, 2014, pp. 1-3.
International Search Report PCT/ISA/210 for International Application No. PCT/EP2015/079522 dated Mar. 29, 2016.
Written Opinion of the International Searching Authority PCT/ISA/237 for International Application No. PCT/EP2015/079522 dated Mar. 29, 2016.

* cited by examiner

SELF-HEATING MITIGATION IN AN ACOUSTICALLY TUNABLE DISTRIBUTED FEEDBACK LASER

CROSS-REFERENCE TO RELATED APPLICATIONS

This application is a national phase under 35 U.S.C. § 371 of PCT International Application No. PCT/EP2015/079522 which has an International filing date of Dec. 14, 2015, which claims priority to European Application No. 15290046.0, filed Jan. 23, 2015, the entire contents of each of which are hereby incorporated by reference.

TECHNICAL FIELD

This application relates to laser assemblies (laser modules) comprising semiconductor lasers, particularly for use in burst-mode operation, and to methods for driving semiconductor lasers, particularly in burst-mode operation. The application particularly relates to laser modules comprising acoustically tunable distributed feedback (ADFB) lasers and methods for driving ADFB lasers in burst-mode operation.

BACKGROUND

Directly tunable lasers, such as e.g. distributed feedback (DFB) lasers suffer from self-heating induced wavelength drifts during burst-mode operation. In signal processing, this drift results in signal degradations when signals generated by these lasers are passed through narrowband wavelength filters at the receive side, e.g. at the optical line termination (OLT) in a time and wavelength division multiplexed passive optical network (TWDM-PON). This issue also applies to ADFB lasers, so that conventional ADFB lasers are not useable in networks with filter widths in the order of 50 GHz or less.

A number of generic mitigation techniques that are applicable to ADFB lasers have been proposed so far, e.g. applying accelerated heating, elevated subthreshold bias current or operation at low output powers. However, in order for these mitigation techniques to be efficient, the respective ADFB laser would need to be driven in a non-optimal point of operation, resulting in system penalties due to e.g. lower power or degraded eye openings.

Thus, there is a need for improved self-heating mitigation techniques applicable to ADFB lasers.

SUMMARY

In view of this need, the present document proposes a laser assembly and a method of driving a semiconductor laser having the features of the respective independent claims.

An aspect of the disclosure relates to a laser assembly (a laser module). The laser assembly may comprise a semiconductor laser with an (optically) active region or gain region (an active semiconductor region) for emitting an optical signal in response to a drive current that is applied to the active semiconductor region, i.e. that is injected to the active semiconductor region, and a drive circuit for generating the drive current in accordance with an input signal and applying the drive current to the active semiconductor region. The laser assembly may further comprise a controllable oscillator for generating a periodic electric signal that is used to generate a surface acoustic wave (SAW) in the semiconductor laser. By applying the periodic electric signal to the semiconductor laser, a surface acoustic wave is generated in the semiconductor material. The periodic electric signal may be applied to layers or regions of the semiconductor laser that comprise piezoelectric electrodes and are arranged in proximity to the active semiconductor region. The surface acoustic wave may be a standing wave. The surface acoustic wave may be generated such that a laser mode in the active semiconductor region may interact with the surface acoustic wave. This interaction may take place in or near the active semiconductor region. Due to the presence of the surface acoustic wave, a diffraction grating structure (i.e. a periodic modulation of the diffraction index of the semiconductor material) is created in the semiconductor laser (e.g. in or near the active semiconductor region) and may interact with the laser mode in the active semiconductor region. An emission wavelength of the active semiconductor region may be determined (set) by a periodicity of the diffraction grating structure (i.e. by a lattice constant of the diffraction grating structure), or correspondingly, by a wavelength of the surface acoustic wave.

The controllable oscillator may be configured to set a frequency of the periodic electric signal in accordance with a control signal. The laser assembly may further comprise a control circuit for generating the control signal for the controllable oscillator. The control circuit may generate the control signal in such a manner that a shift of the emission wavelength away from a predetermined emission wavelength, the shift resulting from heating of the active semiconductor region during emission of the optical signal, is at least partially compensated by an opposite shift of the emission wavelength that results from a change of the periodicity of the diffraction grating structure in or near the active semiconductor region. To this end, the control signal may be configured such that the controllable oscillator is controlled to change the frequency of the periodic electric signal away from a predetermined frequency corresponding to a periodicity of the diffraction grating structure that would, in the absence of self-heating, result in emission at the predetermined emission wavelength. The semiconductor laser may be operated, in burst-mode to emit the optical signal during respective transmission periods and to not emit the optical signal in the intervals between successive transmission periods.

Configured as above, the laser assembly is enabled to keep constant the emission wavelength of the semiconductor laser in a simple and efficient, and non-signal-degrading manner. This is achieved by taking advantage of the working principle of the ADFB laser, for which the emission wavelength is set by a wavelength of a standing surface acoustic wave inside the semiconductor material. Notably, the self-heating mitigation technique employed by the laser assembly does not require modification of the semiconductor laser as such, but merely requires generation of a modified control signal for the controllable oscillator responsible for generating the surface acoustic wave. Consequently, costs for implementing the mitigation technique at hand are very low. By appropriately choosing the shift in frequency of the periodic electric signal, the self-heating induced drift of the emission wavelength can be substantially cancelled, which makes the laser assembly a perfect candidate for use e.g. in TWDM-PONs with filter widths of 50 GHz or less, such as a NG-PON2 network.

In embodiments, the control signal may be a time-dependent control signal. The control circuit may be configured to generate the control signal in such a manner that the controllable oscillator is controlled to increase the frequency of the periodic electric signal during emission of the optical signal, i.e. during respective transmission periods in burst mode operation.

Since self-heating of the semiconductor laser results in an increase of the emission wavelength of the active semiconductor region, the wavelength of the standing surface acoustic wave in the semiconductor material needs to be reduced in order to compensate the self-heating induced shift of the emission wavelength. This is achieved by controlling the controllable oscillator to increase the frequency of the periodic electric signal that is applied to the semiconductor laser during periods of time where the semiconductor laser is operating and the optical signal is emitted.

In embodiments, the control signal may comprise a constant contribution corresponding to the predetermined emission wavelength of the optical signal and a time-dependent contribution corresponding to the shift of the emission wavelength opposite to the shift due to self-heating.

Tuning the constant contribution to the control signal allows to adapt the laser assembly to different desired emission wavelengths, whereas the time-dependent contribution allows to compensate for a self-heating induced shift of the emission wavelength during data bursts of the laser assembly.

In embodiments, the control circuit may be configured to generate the control signal on the basis of the input signal that is also used by the drive circuit for deriving the drive current for the active semiconductor region. Thus, the control circuit receives a copy of the input signal to generate the control signal based thereupon.

In embodiments, the input signal may comprise a rectangular pulse (a burst enable signal; e.g. as a rectangular pulse of a sequence of rectangular pulses, each rectangular pulse corresponding to a respective transmission period) indicating the transmission period, and the control signal may be generated on the basis of the rectangular pulse. In particular, the control signal may be generated on the basis of a shape of the rectangular pulse, in particular the time instants of pulse edges i.e. when the pulse begins and ends, and the height of the pulse. The control signal may correspond to its constant contribution unless the rectangular pulse is present. Further, the control circuit may comprise a pulse shaping circuit for generating an output voltage level (a voltage signal) depending on the rectangular pulse, and the controllable oscillator may be a voltage controlled oscillator (VCO).

In embodiments, the input signal may comprise a data signal indicative of data to be transmitted by means of the optical signal. The control circuit may be configured to determine an envelope of the data signal, and the control signal may be generated on the basis of the envelope of the data signal. In particular, the control signal may be generated on the basis of a shape of the envelope of the data signal. Further, the control circuit may comprise an averaging circuit for determining the envelope of the data signal and a pulse shaping circuit for generating an output voltage level (a voltage signal) depending on the determined envelope of the data signal. For example, the averaging circuit may be a low pass filter. The controllable oscillator may be a voltage controlled oscillator.

Referring to the burst enable signal or to (the envelope of) the data signal provides for convenient means of deriving the control signal necessary for compensating the self-heating induced drift of the emission wavelength during data bursts.

In embodiments, the pulse shaping circuit may comprise a look-up table or a filter unit which may be implemented as an analog electrical filter or a digital filter. For the case of the pulse shaping circuit comprising the look-up table or the digital filter, an analog-to-digital converter and a digital to analog converter may be provided in the pulse shaping circuit. The look-up table may be configured to relate a pulse shape input to the pulse shaping circuit to an appropriate time-dependent voltage level (voltage signal) resulting in a time-dependent frequency of the periodic electric signal that in turn results in a periodicity of the diffraction grating structure that compensates for the drift of the emission wavelength due to self-heating effects. Likewise, the filter unit may be configured to output, for a pulse shape input to the pulse shaping circuit, an appropriate time-dependent signal (e.g. a voltage signal) resulting in a time-dependent frequency of the periodic electric signal that in turn results in a periodicity of the diffraction grating structure that compensates for the drift of the emission wavelength due to self-heating effects. The pulse-shaping circuit may also apply a self-learning algorithm to determine appropriate time-dependent output voltage levels on the basis of input pulse shapes. Further, the pulse shaping circuit may comprise a delay element that delays output of the time-dependent voltage level (voltage signal).

Employing one or more appropriately prepared look-up tables or an appropriately configured filter unit enables to derive the control signal necessary for compensating the self-heating induced drift of the emission wavelength during data bursts based on the burst enable signal or the envelope of the data signal. Any required calibration may be encapsulated in these look-up tables or filter unit such as an analog electric filter.

Another aspect of the disclosure relates to a method of driving a semiconductor laser. The semiconductor laser may have an (optically) active region or gain region (an active semiconductor region) for emitting an optical signal in response to a drive current that is applied to the active semiconductor region, i.e. that is injected to the active semiconductor region. The method may comprise generating the drive current in accordance with an input signal and applying the drive current to the active semiconductor region. The method may further comprise generating a surface acoustic wave in the active semiconductor region by using a periodic electric signal. The method may comprise applying the periodic electric signal to the semiconductor laser, such that a diffraction grating structure (i.e. a periodic modulation of the diffraction index of the semiconductor material) is created in the semiconductor laser (e.g. in or near the active semiconductor region) by the surface acoustic wave. The periodic electric signal may be applied to layers or regions of the semiconductor laser that comprise piezoelectric electrodes and are arranged in proximity to the active semiconductor region. The surface acoustic wave may be a standing wave. The surface acoustic wave may be generated such that a laser mode in the active semiconductor region may interact with the diffraction grating structure generated by the surface acoustic wave. This interaction may take place in or near the active semiconductor region. An emission wavelength of the active semiconductor region may be determined (set) by a periodicity of the diffraction grating structure (i.e. by a lattice constant of the diffraction grating structure), or correspondingly, by a wavelength of the surface acoustic wave.

The method may further comprise controlling a frequency of the periodic electric signal in such a manner that a shift of the emission wavelength away from a predetermined emission wavelength, the shift resulting from heating of the active semiconductor region during emission of the optical signal, is at least partially compensated by an opposite shift of the emission wavelength that results from a change of the periodicity of the diffraction grating structure in the active semiconductor region. To this end, the frequency of the periodic electric signal may be controlled to change away from a predetermined frequency corresponding to a periodicity of the diffraction grating structure that would, in the absence of self-heating, result in emission at the predetermined emission wavelength, in order to compensate self-heating effects on emission wavelength. The semiconductor laser may be operated in burst-mode to emit the optical signal during respective transmission periods and to not emit the optical signal in the intervals between successive transmission periods. The above described compensation is applied during transmission periods where the laser is in operation and generates heat that may produce wavelength drifts.

In embodiments, controlling the frequency of the electric signal may involve increasing the frequency of the periodic electric signal during emission of the optical signal, i.e. during respective transmission periods.

In embodiments, controlling the frequency of the electric signal may involve controlling the frequency of the periodic electric signal on the basis of the input signal that is also used for deriving the drive current for the active semiconductor region.

In embodiments, the input signal may comprise a rectangular pulse (a burst enable signal; e.g. as a rectangular pulse of a sequence of rectangular pulses, each rectangular pulse corresponding to a respective transmission period) indicating a transmission period. Controlling the frequency of the periodic electric signal may involve controlling the frequency of the periodic electric signal on the basis of the rectangular pulse. In particular, this may involve controlling the frequency of the periodic electric signal on the basis of a shape of the rectangular pulse.

In embodiments, the input signal may comprise a data signal indicative of data to be transmitted by means of the optical signal. Controlling the frequency of the periodic electric signal may involve determining an envelope of the data signal and controlling the frequency of the periodic electric signal on the basis of the envelope of the data signal. In particular, this may involve controlling the frequency of the periodic electric signal on the basis of a shape of the envelope of the data signal.

It will be appreciated that method steps and apparatus features may be interchanged in many ways. In particular, the details of the disclosed apparatus can be implemented as a method, as the skilled person will appreciate.

BRIEF DESCRIPTION OF THE FIGURES

Embodiments of the disclosure are explained below in an exemplary manner with reference to the accompanying drawings, wherein FIG. 1 schematically illustrates an example of a laser assembly according to embodiments of the disclosure.

DETAILED DESCRIPTION

Figure 1:
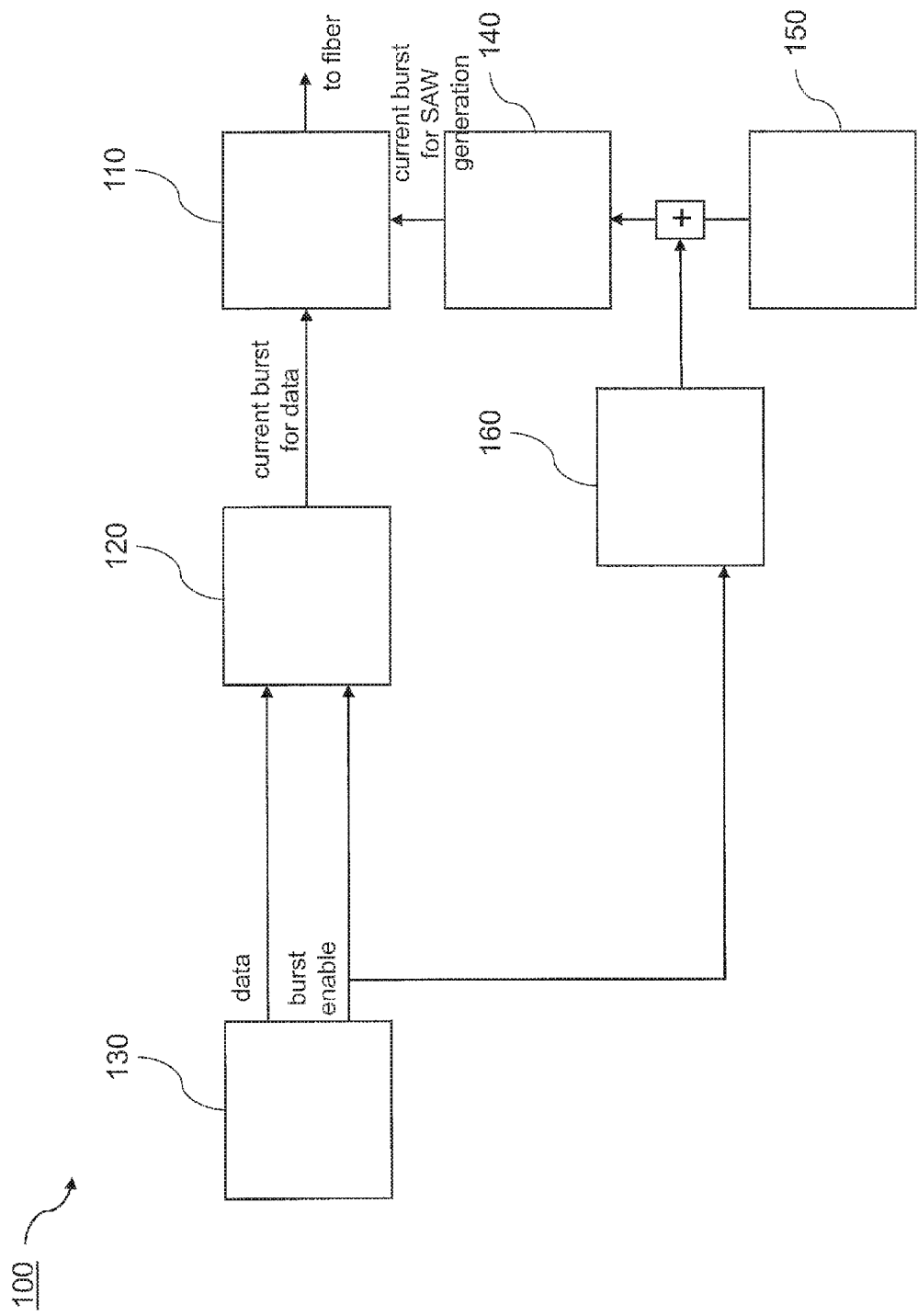

FIG. 1 schematically illustrates an example of a laser assembly (laser module) 100 according to embodiments of the disclosure. The laser assembly 100 comprises a semiconductor laser 110, which is an ADFB laser or any other semiconductor laser in which a diffraction grating structure is created by means of generating a surface acoustic wave in the semiconductor material, and a drive circuit (laser driver) 120 for driving the semiconductor laser 110, i.e. for generating a drive current for the semiconductor laser 110. The laser assembly 100 receives an input signal from a logic circuit (e.g. a PON logic) 130 and feeds the input signal to the drive circuit 120. The laser assembly 100 further comprises a controllable oscillator (oscillator circuit, e.g. a VCO, optionally having an integrated RF amplifier) 140, and a controllable voltage source 150 for generating an adjustable DC voltage signal that is fed to the controllable oscillator 140. The laser assembly 100 further comprises a pulse shaping circuit (pulse shaper) 160.

The semiconductor laser 110 comprises an active semiconductor region (gain region, optically active region) for emitting an optical signal in response to the drive current that is applied to the active semiconductor region. The active semiconductor region may be a semiconductor layer or part of a semiconductor layer. The wavelength selection mechanism of the semiconductor laser 110 (which may be an ADFB laser) is based on creating a standing surface acoustic wave inside the semiconductor material. Presence of the standing surface acoustic wave in the semiconductor material results in a periodic modulation of the diffraction index of the semiconductor material (e.g. in or near the active semiconductor region), and thus effectively generates a diffraction grating structure. The wavelength of the surface acoustic wave in the semiconductor material, i.e. the periodicity (lattice constant) of the diffraction grating structure, determines the wavelength of the optical emission of the semiconductor laser 110 by interaction, in or near the active semiconductor region, of the laser mode in the active semiconductor region with the diffraction grating structure.

The controllable oscillator 140 generates a periodic electric signal (an RF driving signal) that is applied to the semiconductor laser 110. The periodic electric signal may be applied to layers or regions of the semiconductor laser 110 that comprise piezoelectric electrodes and are arranged in proximity to the active semiconductor region. The periodic electric signal may be a periodic voltage signal. Application of the periodic electric signal to the semiconductor laser 110 creates the standing surface acoustic wave in the semiconductor material, i.e. also in or near the active semiconductor region, e.g. through the piezo-electric effect. A frequency of the periodic electric signal is set by the controllable oscillator 140 in accordance with a control signal (e.g. a voltage signal) that is input to the controllable oscillator 140. The emission wavelength of the semiconductor laser 110 can be tuned by changing the frequency of the periodic electric signal that is applied to the semiconductor material and that creates the surface acoustic wave. The controllable voltage source 150 generates a voltage signal that forms a contribution to the control signal that is input to the controllable oscillator 140. For a given desired emission wavelength of the semiconductor laser 110, the voltage signal generated by the controllable voltage source 150 is constant. If desired, the emission wavelength of the semiconductor laser 110 can be tuned by changing the voltage level of the voltage signal generated by the controllable voltage source 150, while during operation of the semiconductor laser 110 the voltage level of the voltage signal generated by the controllable voltage source 150 remains constant, as indicated above.

The input signal generated by the logic circuit 130 comprises a burst enable signal (a sequence of rectangular pulses, each rectangular pulse corresponding to a respective transmission period) indicating transmission periods of the semiconductor laser 110 and biasing the semiconductor laser 110 at its operation point, and a data signal indicating actual data to be transmitted by means of optical emission by the semiconductor laser 110. The burst enable signal and the data signal are fed to the drive circuit 120, and the burst enable signal is additionally fed to the pulse shaping circuit 160. The drive circuit 120 generates the drive current that is applied to the active semiconductor region of the semiconductor laser 110 on the basis of the input signal, i.e. on the basis of the burst enable signal and/or the data signal.

If now the emission wavelength of the semiconductor laser 110 changes during a burst (i.e. during a transmission period) due to the self-heating effect in the active semiconductor region of the semiconductor laser 110, this shift of emission wavelength is compensated for, at least partially, by slightly detuning the frequency of the periodic electric signal (RF driving frequency) generated by the controllable oscillator 140. In particular, the frequency of the periodic electric signal is slightly detuned such as to modify the wavelength of the standing surface acoustic wave (and correspondingly the periodicity of the diffraction grating structure) in the semiconductor material and thus to shift the emission wavelength of the semiconductor laser 110 into the opposite direction compared to the self-heating induced shift. If implemented correctly, the self-heating induced shift and the surface acoustic wave induced shift cancel out each other.

Detuning the frequency of the periodic electric signal is performed as follows in the laser assembly 100 of FIG. 1. The burst enable signal included in the input signal, which essentially corresponds to a sequence of rectangular pulses (each rectangular pulse corresponding to a respective transmission period), is fed to the pulse shaping circuit 160, as indicated above. The pulse shaping circuit 160 generates a time-dependent contribution to the control signal on the basis of the burst enable signal (e.g. on the basis of a shape thereof). For instance, the pulse shaping circuit 160 may generate a time-dependent voltage signal on the basis of the burst enable signal, i.e. output a time-dependent voltage level depending on the burst enable signal. The pulse shaping circuit 160 is configured to generate the time-dependent contribution to the control signal for the controllable oscillator 140 in such a manner that appropriate detuning of the frequency of the periodic electric signal (and correspondingly, an appropriate shift of the emission wavelength that cancels the self-heating induced shift) is achieved.

The controllable voltage source 150 and the pulse shaping circuit 160 may be said to form a control circuit for generating the control signal for the controllable oscillator 140 on the basis of the input signal. Referring again to the above-described detuning of the frequency of the periodic electric signal, the control circuit for generating the control signal for the controllable oscillator 140 can be said to generate the control signal in such a manner that a shift of the emission wavelength away from a predetermined emission wavelength, that results from heating of the active semiconductor region during emission of the optical signal (i.e. from self-heating), is—at least partially—compensated by an opposite shift of the emission wavelength that results from the change of the periodicity of the diffraction grating structure in or near the active semiconductor region.

Figure 2:
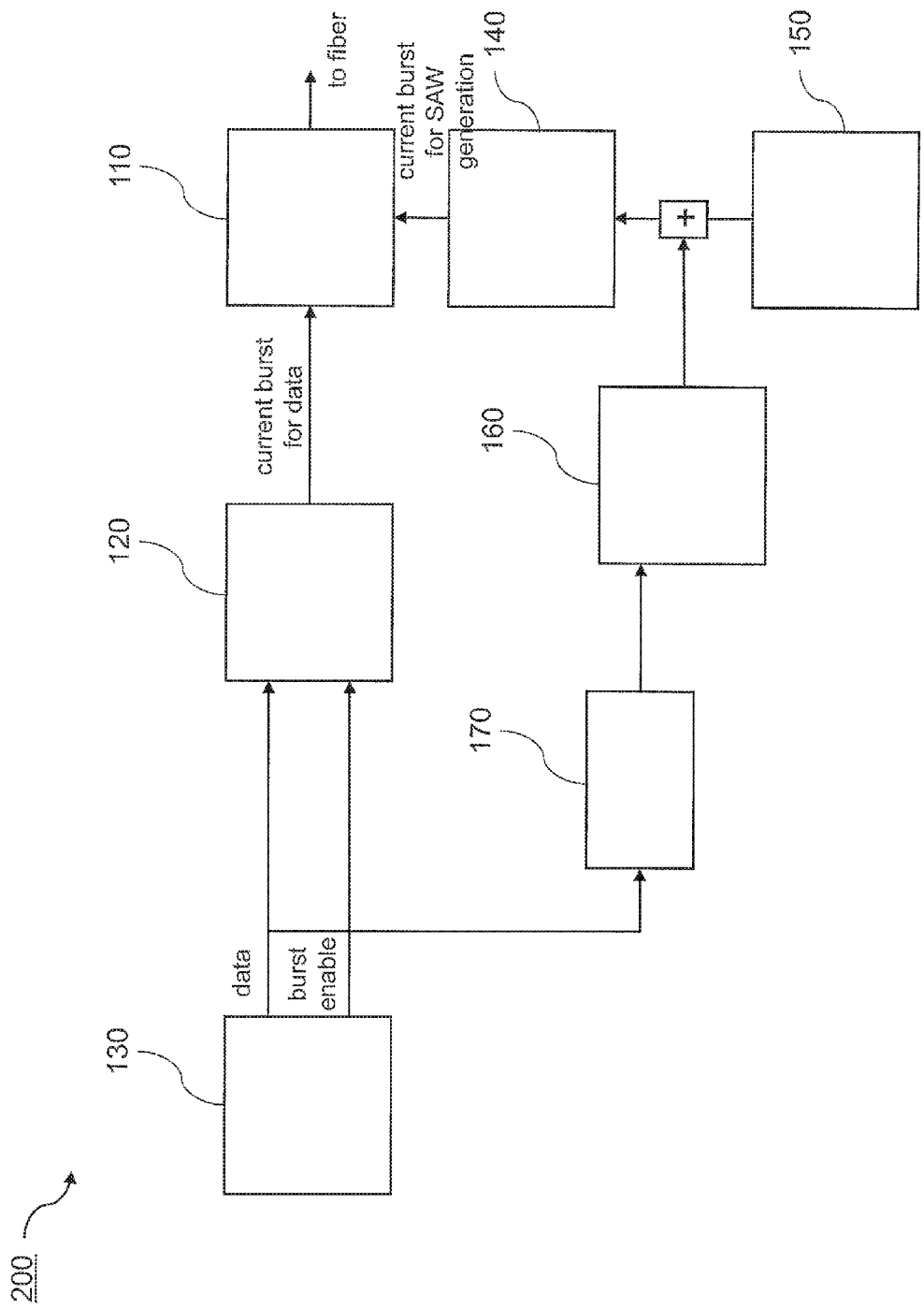
FIG. 2 schematically illustrates another example of a laser assembly according to embodiments of the disclosure.

FIG. 2 schematically illustrates another example of a laser assembly (laser module) 200 according to embodiments of the disclosure. The laser assembly 200 comprises the semiconductor laser 110, the drive circuit 120, the controllable oscillator 140, the controllable voltage source 150, and the pulse shaping circuit 160 described above with reference to FIG. 1, and receives an input signal from the logic circuit 130 for feeding to the drive circuit 120. Unless indicated otherwise, these components of the laser assembly 200 correspond to respective like-numbered components of the laser assembly 100 described above.

The laser assembly 200 of FIG. 2 further comprises an averaging circuit (averager) 170 to which the data signal output by the logic circuit 130 is fed. The averaging circuit 170 may be a low pass filter. By contrast to FIG. 1, the burst enable signal is not fed to the pulse shaping circuit 160 in this configuration.

In the laser assembly 200 of FIG. 2, detuning the frequency of the periodic electric signal is performed as follows. The data signal included in the input signal is fed to the averaging circuit 170, as indicated above. The averaging circuit 170 generates an envelope of the data signal on the basis of the data signal. Said envelope of the data signal, which is essentially a sequence of rectangular pulses (each rectangular pulse corresponding to a respective transmission period), is fed to the pulse shaping circuit 160. The pulse shaping circuit 160 generates a time-dependent contribution to the control signal on the basis of the envelope of the data signal (e.g. on the basis of a shape thereof). For instance, the pulse shaping circuit 160 may generate a time-dependent voltage signal (output a time dependent voltage signal) on the basis of the envelope of the data signal. The pulse shaping circuit 160 is configured to generate the time-dependent contribution to the control signal for the controllable oscillator 140 in such a manner that appropriate detuning of the frequency of the periodic electric signal (and correspondingly, an appropriate shift of the emission wavelength that cancels the self-heating induced shift) is achieved.

The controllable voltage source 150, the pulse shaping circuit 160, and the averaging circuit 170 may be said to form a control circuit for generating the control signal for the controllable oscillator 140 on the basis of the input signal. Referring again to the above-described detuning of the frequency of the periodic electric signal, the control circuit for generating the control signal for the controllable oscillator 140 can be said to generate the control signal in such a manner that a shift of the emission wavelength away from a predetermined emission wavelength, that results from heating of the active semiconductor region during emission of the optical signal (i.e. from self-heating), is—at least partially—compensated by an opposite shift of the emission wavelength that results from the change of the periodicity of the diffraction grating structure in or near the active semiconductor region.

In both the above examples, the required amount of detuning of the frequency of the periodic electric signal as well as its time-dependence have to be determined on a per laser structure and/or wafer basis, i.e. by measuring and evaluating a couple of sample devices. Then the appropriate detuning can be implemented by e.g. using one or more look-up tables in generating (the time-dependent contribution to) the control signal, or by generating (the time-dependent contribution to) the control signal using an appropriate filter unit, e.g. implemented as a digital filter or an analog electrical filter. The look-up table and the filter unit may be comprised by the pulse shaping circuit 160. Further, it is also conceivable to implement a self-learning algorithm in an intra-module ASIC, µProcessor etc., taking advantage of a control signal derived from a receiver behind a narrow-band optical filter, either in a lab test set-up or in the network in operation.

Further, in both the above examples, the control circuit may be configured to generate the control signal in such a manner that the frequency of the periodic electric signal is increased during a data burst (during emission of the optical signal), i.e. the control circuit may control the controllable oscillator 140 to increase the frequency of the periodic electric signal during the data burst. Typically, self-heating results in a gradual increase of the emission wavelength of the semiconductor laser 110. In order to compensate for this shift of emission wavelength away from the predetermined wavelength, the wavelength of the standing surface acoustic wave (i.e. the periodicity of the diffraction grating structure) is appropriately decreased by appropriately increasing the frequency of the periodic electric signal.

Figure 3:
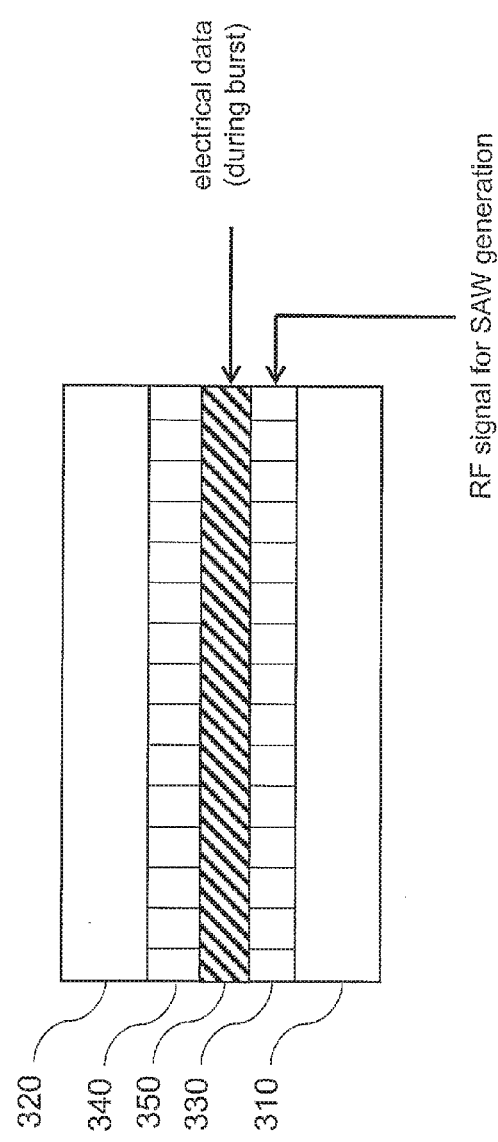
FIG. 3 schematically illustrates an example of a semiconductor laser in laser assemblies according to embodiments of the disclosure.

FIG. 3 schematically illustrates an example of a semiconductor laser 110 in laser assemblies according to embodiments of the disclosure. The semiconductor laser 110 comprises a semiconductor substrate 310, 320 and an active semiconductor region (active region, gain region), or laser stripe 350. On both sides, the active semiconductor region 350 borders on layers 330, 340 comprising piezoelectric electrodes that are driven by the periodic electric signal and generate the surface acoustic wave. It is understood that alternative means for generating the surface acoustic wave are readily apparent to the skilled person and that the present disclosure shall not be construed to be limited to the use of piezoelectric electrodes for generating the surface acoustic wave.

Figure 4:
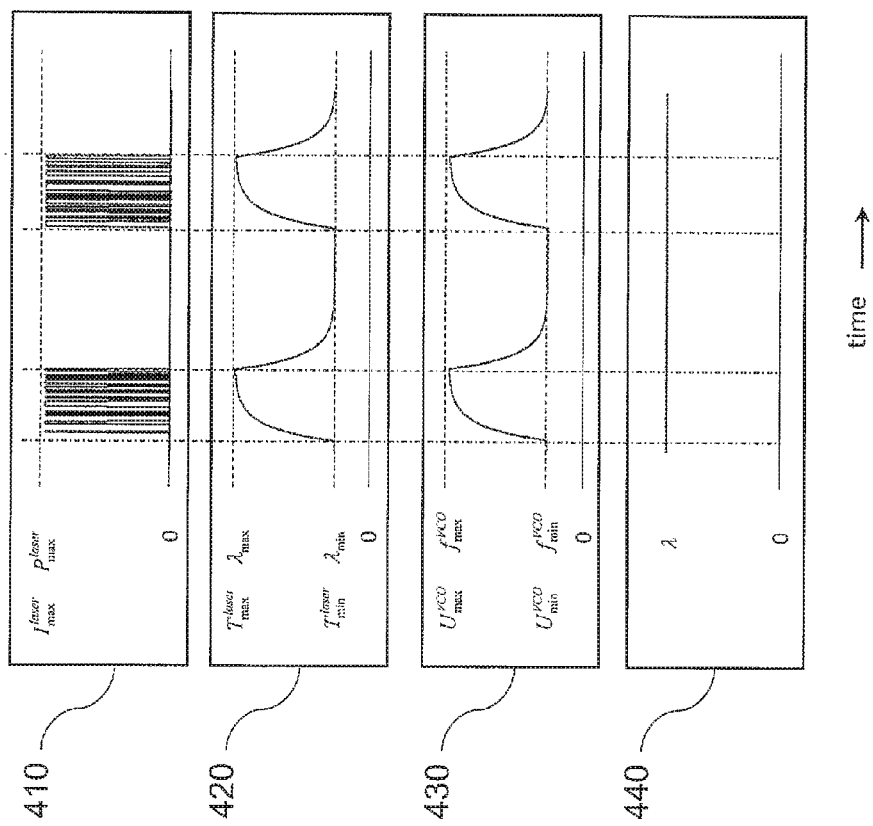
FIG. 4 is a schematic timing diagram of time-dependent quantities related to operation of laser assemblies according to embodiments of the invention.

FIG. 4 is an exemplary schematic timing diagram of time-dependent quantities related to operation of laser assemblies according to embodiments of the invention. The topmost diagram 410 indicates the laser drive current output by the drive circuit 120 and injected to the active semiconductor region of the semiconductor laser 110, and the output optical power of the semiconductor laser 110. In this schematic representation, the laser drive current and the output optical power are illustrated to have qualitatively the same variation in time. The second diagram 420 from the top indicates the laser temperature within the active semiconductor layer and the emission wavelength of the optical signal output by the semiconductor laser 110 during data bursts, both for a case in which the self-heating technique according to the disclosure is not applied. Also the laser temperature and the emission wavelength are schematically illustrated to have qualitatively the same variation in time. Needless to say, the emission wavelength is understood to be zero during intervals between data bursts. The third diagram 430 from the top indicates the control signal (voltage signal) that is input to the controllable oscillator 140 and the frequency of the periodic electric signal output by the controllable oscillator 140. Also the control signal and the frequency of the periodic electric signal are schematically illustrated to have qualitatively the same variation in time. The lowermost diagram 440 indicates the emission wavelength of the optical signal output by the semiconductor laser 110 during data bursts for the case in which the self-heating technique according to the disclosure is applied.

As can be seen from FIG. 4, without applied self-heating mitigation technique, the laser temperature rises during data bursts, and the emission wavelength increases proportionally to the temperature increase. The control signal for the controllable oscillator 140 as well as the frequency of the periodic electric signal output by the controllable oscillator 140 are substantially proportional to the drift of the emission wavelength. If the self-heating mitigation technique according to the disclosure is applied, the emission wavelength is substantially constant over time during data bursts.

It should be noted that the apparatus features described above correspond to respective method features that are however not explicitly described, for reasons of conciseness. The disclosure of the present document is considered to extend also to such method features.

It should be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed apparatus. Furthermore, all statements herein providing principles, aspects, and embodiments of the invention, as well as specific examples thereof, are intended to encompass equivalents thereof.

The invention claimed is:

1. A laser assembly, comprising:
a semiconductor laser with an active semiconductor region for emitting an optical signal in response to a drive current that is applied to the active semiconductor region;
a drive circuit for generating the drive current in accordance with an input signal and applying the drive current to the active semiconductor region;
a controllable oscillator for generating a periodic electric signal that is applied to the semiconductor laser to generate a surface acoustic wave in or near the active semiconductor region such that a diffraction grating structure is created in or near the active semiconductor region by the surface acoustic wave, an emission wavelength of the active semiconductor region being determined by a periodicity of the diffraction grating structure, wherein the controllable oscillator is configured to set a frequency of the periodic electric signal in accordance with a control signal; and
a control circuit for generating the control signal for the controllable oscillator in such a manner that a shift of the emission wavelength away from a predetermined emission wavelength that results from heating of the active semiconductor region during emission of the optical signal is at least partially compensated by an opposite shift of the emission wavelength that results from a change of the periodicity of the diffraction grating structure in or near the active semiconductor region.

2. The laser assembly according to claim 1, wherein the control signal is a time-dependent control signal.

3. The laser assembly according to claim 1, wherein the control circuit is configured to generate the control signal in such a
manner that the controllable oscillator (140) increases the frequency of the periodic electric signal during emission of the optical signal.

4. The laser assembly according to claims 1, wherein the control signal comprises a constant contribution corresponding to the predetermined emission wavelength and a time-dependent contribution corresponding to the opposite shift of the emission wavelength.

5. The laser assembly according to claims 1, wherein the control circuit is configured to generate the control signal on the basis of the input signal.

6. The laser assembly according to claims 1, wherein the input signal comprises a rectangular pulse indicating a transmission period, and the control signal is generated on the basis of the rectangular pulse.

7. The laser assembly according to claim 6,
wherein the control circuit comprises a pulse shaping circuit for generating an output voltage level depending on the rectangular pulse; and
the controllable oscillator is a voltage controlled oscillator.

8. The laser assembly according to claim 7, wherein the pulse shaping circuit comprises a look-up table or a filter unit.

9. The laser assembly according to any claims 1,
wherein the input signal comprises a data signal indicative of data to be transmitted by means of the optical signal;
the control circuit is configured to determine an envelope of the data signal; and
the control signal is generated on the basis of the envelope of the data signal.

10. The laser assembly according to claim 9,
wherein the control circuit comprises an averaging circuit for determining the envelope of the data signal and a pulse shaping circuit for generating an output voltage level depending on the determined envelope of the data signal; and
the controllable oscillator is a voltage controlled oscillator.

11. A method of driving a semiconductor laser having an active semiconductor region for emitting an optical signal in response to a drive current that is applied to the active semiconductor region, the method comprising:
generating the drive current in accordance with an input signal and applying the drive current to the active semiconductor region;
generating a surface acoustic wave in or near the active semiconductor region by applying a periodic electric signal to the semiconductor laser such that a diffraction grating structure is created in or near the active semiconductor region by the surface acoustic wave, an emission wavelength of the active semiconductor region being determined by a periodicity of the diffraction grating structure; and
controlling a frequency of the periodic electric signal in such a manner that a shift of the emission wavelength away from a predetermined emission wavelength that results from heating of the active semiconductor region during emission of the optical signal is at least partially compensated by an opposite shift of the emission wavelength that results from a change of the periodicity of the diffraction grating structure in or near the active semiconductor region.

12. The method according to claim 11, wherein controlling the frequency of the electric signal involves increasing the frequency of the periodic electric signal during emission of the optical signal.

13. The method according to claim 11, wherein controlling the frequency of the electric signal involves controlling the frequency of the periodic electric signal on the basis of the input signal.

14. The method according to claims 11,
wherein the input signal comprises a rectangular pulse indicating a transmission period; and
controlling the frequency of the periodic electric signal involves controlling the frequency of the periodic electric signal on the basis of the rectangular pulse.

15. The method according to claims 11,
wherein the input signal comprises a data signal indicative of data to be transmitted by means of the optical signal; and
controlling the frequency of the periodic electric signal involves:
determining an envelope of the data signal and controlling the frequency of the periodic electric signal on the basis of the envelope of the data signal.

* * * * *